United States Patent [19]
Ogawa

[11] Patent Number: 6,163,189
[45] Date of Patent: *Dec. 19, 2000

[54] LATCH CIRCUIT CAPABLE OF REDUCING SLEW CURRENT

[75] Inventor: Tadahiko Ogawa, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/059,894

[22] Filed: Apr. 14, 1998

[30] Foreign Application Priority Data

Apr. 18, 1997 [JP] Japan .................................. 9-116417

[51] Int. Cl.[7] .................................................. H03K 3/356
[52] U.S. Cl. ........................ 327/201; 327/208; 327/210
[58] Field of Search .................................. 327/199–203, 327/208–215, 217, 218

[56] References Cited

U.S. PATENT DOCUMENTS

| | | | |
|---|---|---|---|
| 4,506,167 | 3/1985 | Little et al. | 327/202 |
| 4,569,067 | 2/1986 | Ballup | 327/203 |
| 5,095,225 | 3/1992 | Usui | 327/211 |
| 5,486,777 | 1/1996 | Nguyen | 326/68 |
| 5,789,956 | 8/1998 | Mahant-Shetti et al. | 327/202 |
| 5,808,957 | 9/1998 | Lee et al. | 365/230.08 |

FOREIGN PATENT DOCUMENTS

| | | |
|---|---|---|
| 61-196614 | 8/1986 | Japan . |
| 62-90031 | 4/1987 | Japan . |
| 5-268000 | 10/1993 | Japan . |
| 7-131302 | 5/1995 | Japan . |
| 8-046495 | 2/1996 | Japan . |

OTHER PUBLICATIONS

Masakazu Shoji, "CMOS Digital Circuit Technology", Computing Science Research Center, AT&T Bell Laboratories, pp. 157–159, Prentice Hall, Englewood Cliffs, New Jersey, 07632, 1988.

*Primary Examiner*—Tuan T. Lam

[57] ABSTRACT

A latch circuit for eliminating slew current flowing in between power sources during period when clock signal changes. In the latch circuit, an input terminal is formed in such a way that dual transfer gates are connected to respective nodes remaining differential signal of bistable circuit which is constituted that one pair of clocked•CMOS inverter is subjected to mesh connection. An output terminal of holding signal of latch circuit is drains of PMOS and NMOS transistors being adjacent to end terminal of power source, which transistors are member of the one pair of clocked•CMOS inverter. Gates of PMOS and NMOS transistors being adjacent to side of output terminal are taken to be input terminal of gate signal of the latch circuit. During period of sampling calculation, since there exists MOS transistor which is connected in series between power sources and which is sure to stand of OFF state, it is capable of cutting transient slew current flowing between power sources.

6 Claims, 11 Drawing Sheets

F I G. 7
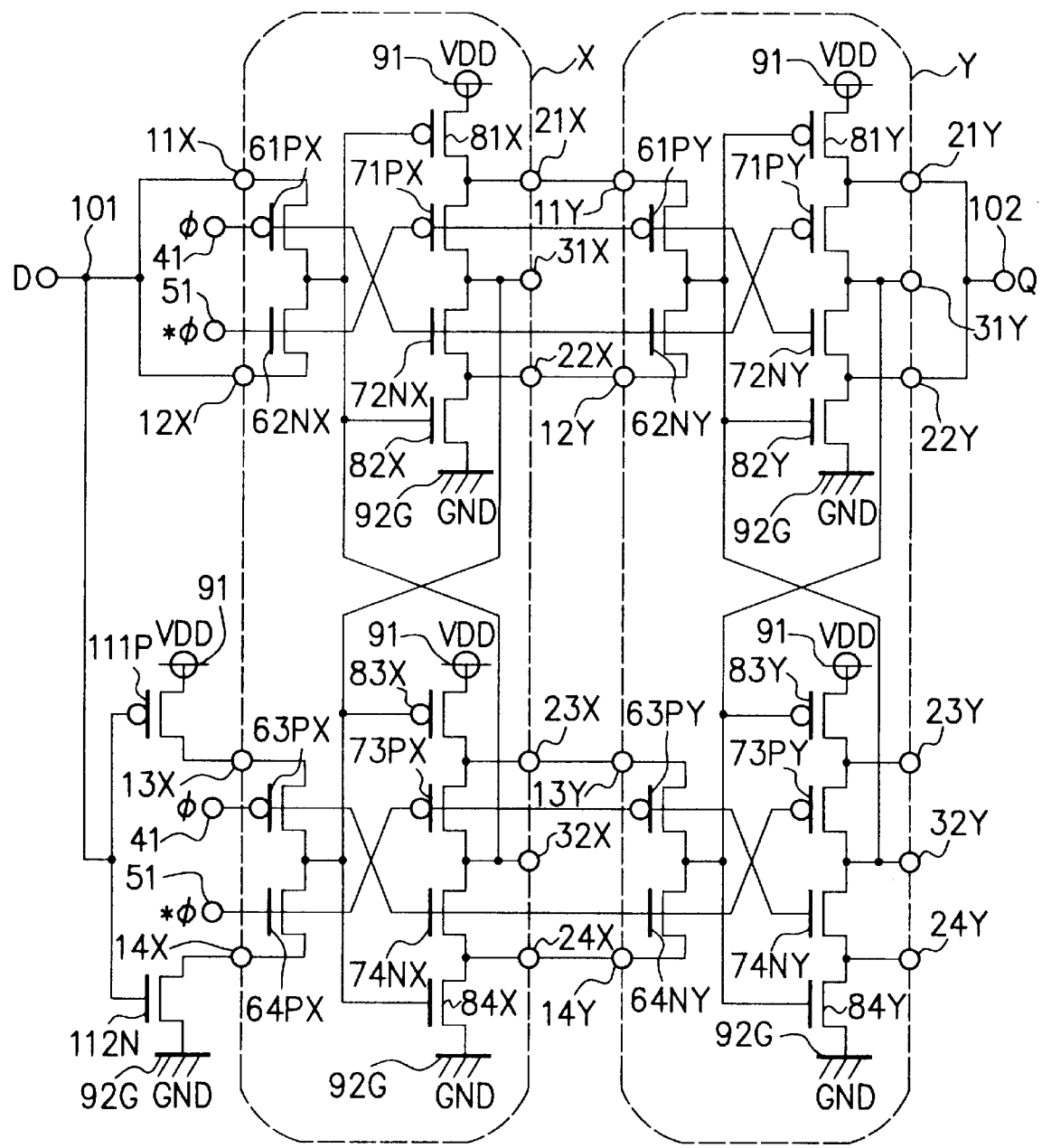

LATCH CIRCUIT CAPABLE OF REDUCING SLEW CURRENT

BACKGROUND OF THE INVENTION

The present invention relates a latch circuit. More particularly this invention relates to a latch circuit in which information is capable of dealing with stably and operation thereof is implemented with high speed. Further, it is capable of achieving reduction of power dissipation, thus it is preferable in use for constructing a semiconductor device.

DESCRIPTION OF THE PRIOR ART

Formerly, this kind of latch circuit, for instance, as shown in the Japanese Patent Application Laid-Open No. HEI 5-268000, is in use for achieving the object to cause the information to hold stably and to cause operation speed to enhance. FIG. 1 is a view showing one example of circuit construction of the conventional latch circuit.

As shown in FIG. 1, a data signal input terminal 911 on one side is connected to an input terminal of a CMOS inverter 131 through a transfer gate 961T. An inverse data signal input terminal 912 on the other side is connected to an input terminal of a CMOS inverter 132 through a transfer gate 962T. An output terminal of a CMOS inverter 132 is connected to an input terminal of the CMOS inverter 131 through a transfer gate 971T.

An output terminal of the CMOS inverter 131 is connected to an input terminal of the CMOS inverter 132 through a transfer gate 972T.

The transfer gates 961T, 962T, 971T, and 972T cause both a PMOS transistor and a NMOS transistor, and the PMOS transistor and the NMOS transistor to connect in parallel, thus inputting complementary signal to gate of respective transistors.

Both the gate of the NMOS transistor for the transfer gate 961T, and the gate of the NMOS transistor for the transfer gate 962T, the gate of the PMOS transistor for the transfer gate 971T the gate of the PMOS transistor for the transfer gate 972T are commonly connected to a clock signal input terminal 41, to which clock signal $\phi$ is supplied.

Similarly, the gate of the PMOS transistor for the transfer gate 961T, the gate of the PMOS transistor for the transfer gate 962T, the gate of the NMOS transistor for the transfer gate 971T, and the gate of the NMOS transistor for the transfer gate 972T are commonly connected to an inverse clock signal input terminal 51, to which inverse clock signal *$\phi$ is supplied. Here, the inverse (complementary) signal of one signal is indicated by mark "*".

Next, operation of latch circuit of the above constitution will be explained referring to FIG. 2.

It is assumed that a clock signal $\phi$ is "0", and an inverse clock signal *$\phi$ is "1", the transfer gates 961T, 962T stand in an OFF state, and the transfer gates 971T, 972T stand in an ON state, an input data signal D and an inverse output data signal *Q stand of "1", an inverse input data signal *D and an output data signal Q stand of "0".

At this condition, when the clock signal $\phi$ changes into "1" and the inverse clock signal *$\phi$ changes into "0", the transfer gates 961T, 962T change into ON state and the transfer gates 971T, 972T change into OFF state.

Under these states, mesh connection (connection with sleeves tucked up) between the CMOS inverters 131 and 132 is intercepted, namely, the input data signal D and the inverse output data signal *Q come into inverse slew-state thereby, no current of the input data signal D flows into the CMOS inverter 132 through the transfer gates 961T and 971T so that the inverse output data signal *Q and the output data signal Q of the CMOS inverters 131 and 132 is inverted at high speed.

Namely, delay time period from the time when the clock signal $\phi$ and the inverse clock signal *$\phi$ become active state to the time when the output data signal of the CMOS inverters 131 and 132 are inverted, becomes the sum of the time period when the transfer gates 961T and 962T change from OFF state to ON state, and signal propagation delay time the CMOS inverters 131 and 132, thus the delay time is reduced.

Next, when the clock signal $\phi$ changes into "0" and the inverse clock signal *$\phi$ changes into "1", the transfer gates 961T and 962T come into OFF state, the transfer gates 971T and 972T stand in a bistable circuit, thus the inverse output data signal *Q and the output data signal Q are maintained. In the so-called latch-state, the maintained information is stable because the CMOS inverter 131 is connected to the CMOS inverter 132 by low resistance.

However, in the above described conventional latch circuit, there is the problem that when frequency of the clock signal increases, power dissipation increases in proportion to the frequency.

Because the CMOS inverters 131 and 132 which are member of the conventional latch circuit adopt totem-pole type push-pull circuit constitution. This matter is described in Masakazu Shoji "CMOS Digital Circuit Technology", Prentice-Hall, Inc., New-Jersey, 1988, pp. 157–159. According to the document, the CMOS inverter 131 comprises the PMOS transistor 981 and the NMOS transistor 982 whose respective gates and drains are connected commonly, thereby causing the common gate terminals to be input terminals and the common drain terminals to be output terminals, and connecting the source of the PMOS transistor to high electric potential power source terminal 91, and connecting the source of NMOS transistor 982 to low electric potential power source terminal 92, results in the totem-pole type push-pull circuit constitution.

Consequently, with respect to the CMOS inverter 131, both the PMOS transistor 981 and the NMOS transistor 982 come into saturated state in this transient process when the signal supplied to input terminal changes, namely, time period when the PMOS transistor and NMOS transistor stand in an ON state, so that slew current flows between high electric potential power source terminal 91 and low electric potential power source terminal 92, thus consuming unnecessary dead power.

Further, when the clock signal $\phi$ changes from "0" to "1", and the inverse clock signal *$\phi$ changes from "1" to "0", the transfer gates 961T and 962T change from OFF state to ON state and the transfer gates 971T and 972T change from ON state to OFF state. Subsequently, the mesh connection state of the CMOS inverters 131 and 132 comes into a cut-off state, the input data signal D and the inverse output data signal *Q come into an inverse slew-state, with the result that a respective inverse output data signal *Q and the output data signal Q of the CMOS inverters 131 and 132 are inverted with high speed.

Consequently, whenever the clock signal $\phi$ changes from "0" to "1" and the inverse clock signal *$\phi$ changes from "1" to "0", there is an opportunity to consume slew current in the CMOS inverters 131 and 132, thus power dissipation increases in proportion to frequency in accordance with increasing of frequency of the clock signal.

SUMMARY OF THE INVENTION

In view of the foregoing it is an object of the present invention to resolve the above mentioned problem to provide a latch circuit which is capable of diminishing power dissipation in the latch circuit having stability of information and capable of high speed operation.

It is another object of the present invention to provide a latch circuit which is capable of eliminating slew current flowing in between power sources during sampling calculation by the latch circuit.

In accordance with one aspect of the present invention, for achieving the above-mentioned objects, there is provided a latch circuit comprising a pair of sampling switch elements connected to respective nodes which maintain differential signals of a bistable circuit which is constituted in such a way that it causes a pair of clocked•CMOS inverters to be subjected to mesh connection, an input terminal which is constituted in such a way that the pair of sampling switch elements are connected to the nodes, an output terminal of holding signal which is drain terminal of both of PMOS transistor and NMOS transistor being adjacent to end terminal side of power source in the pair of clocked•CMOS inverter, and a pair of holding switch elements provided for a place adjacent to a side of output terminal, wherein the pair of sampling switch elements and the pair of holding switch elements are ON/OFF controlled complementarily.

In accordance with another aspect of the present invention, there is provided a latch circuit comprising a transfer gate connected to respective nodes which maintain differential signals of a bistable circuit which is constructed in such a way that it causes a pair of clocked•CMOS inverters connected via mesh connection, an input terminal for sampling signal which is constituted in such a way that the transfer gate is connected to the nodes, an output terminal of holding signal which is drain terminal of both of PMOS transistor and NMOS transistor being adjacent to end terminal side of power source in the pair of clocked•CMOS inverters, and an input terminal for control signal of a latch circuit which terminal is gate terminal of both of PMOS transistor and NMOS transistor being adjacent to side of output terminal, wherein at least one of MOS transistors connected in series in between power sources in sampling period comes into OFF state.

In accordance with still another aspect of the present invention, there is provided a latch circuit comprising first pair of data signal input terminals being connected commonly to gates of first pair of complementary symmetrical PMOS transistor and NMOS transistor through first pair of respective sampling switch elements, second pair of data signal input terminals being connected commonly to gates of second pair of complementary symmetrical PMOS transistor and NMOS transistor through second pair of respective sampling switch elements, sources of the first pair of complementary symmetrical PMOS transistor and NMOS transistor being connected to high electric potential power source terminal and low electric potential power source terminal respectively, and drains thereof being connected to first pair of data signal output terminals respectively, sources of the second pair of complementary symmetrical PMOS transistor and NMOS transistor being connected to high electric potential power source terminal and low electric potential power source terminal respectively, and drains thereof being connected to second pair of data signal output terminals respectively, the first pair of data signal output terminals being connected commonly to the gates of the second pair of complementary symmetrical PMOS transistor and NMOS transistor through the first pair of holding switch elements respectively, and the second pair of data signal output terminals being connected commonly to the gates of the first pair of complementary symmetrical PMOS transistor and NMOS transistor through the second pair of holding switch elements respectively, wherein operating method of the latch circuit comprising the steps of controlling complementarily both of the first pair of data signal input terminals and second pair of data signal input terminals, controlling complementarily the first pair of data signal input terminals with each other, controlling complementarily the second pair of data signal input terminals with each other, and controlling complementarily both of the first pair of sampling switch elements and the second pair of sampling switch elements, and the first pair of holding switch elements and the second pair of holding switch elements with each other.

Preferably in the above still another aspect, there is provided a latch circuit wherein the gates to which the first pair of complementary symmetrical PMOS transistor and NMOS transistor are connected to a third data signal output terminal and gates to which the second pair of complementary symmetrical PMOS transistor and NMOS transistor are connected, to a fourth data signal output terminal.

Preferably in the above still another aspect there is provided a latch circuit wherein the first pair of sampling switch elements, second pair of sampling switch elements, the first holding switch elements, and the second holding switch elements are constituted by MOS transistor.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIG. 7 is a view showing the configuration of a master slave type D flip-flop circuit according to a third embodiment of the present invention;

DETAILED DESCRIPTION OF THE PREFERRED EMBODIMENTS

Figure 1:
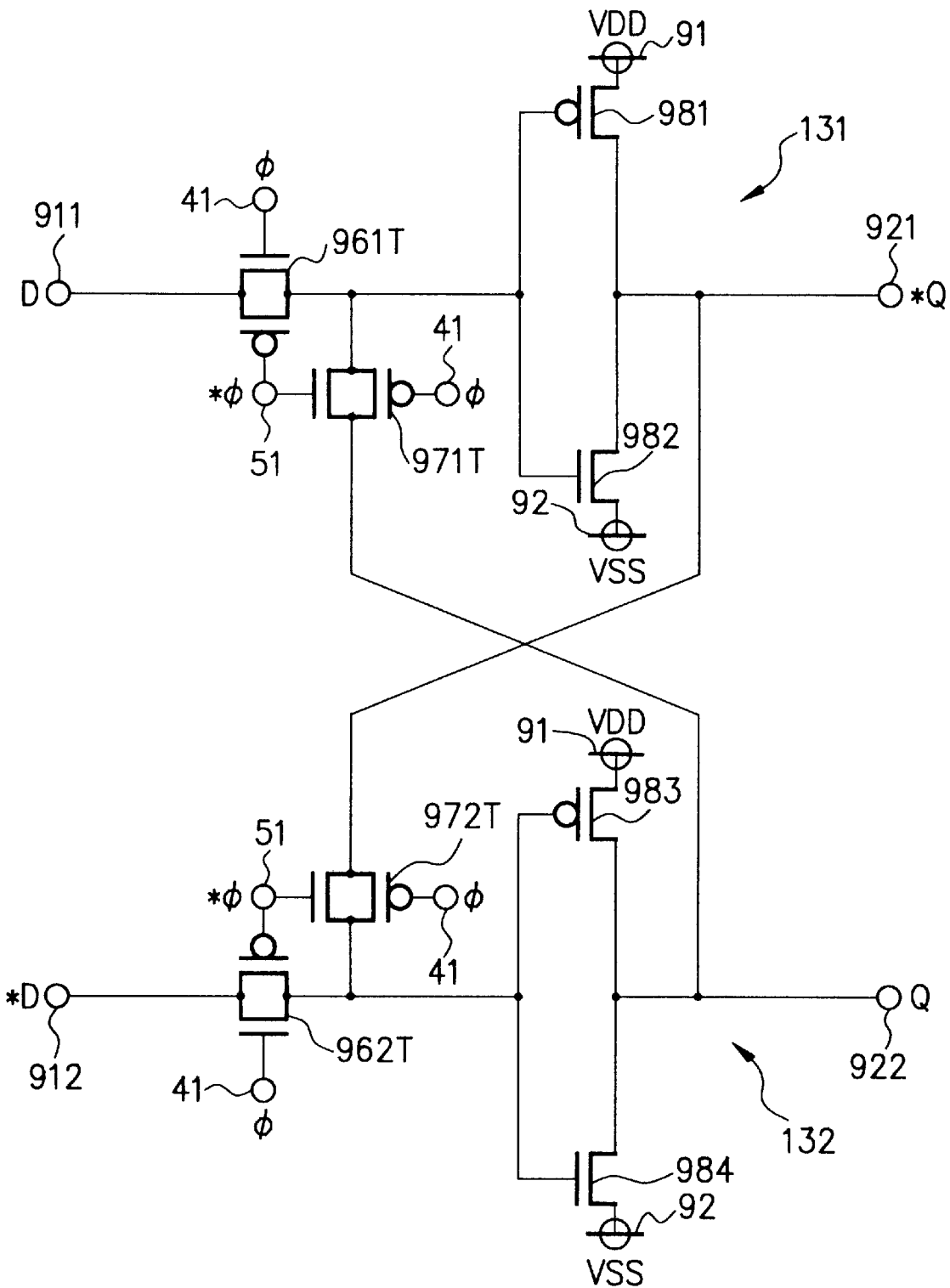
FIG. 1 a view showing the configuration of the conventional latch circuit.
Figure 2:
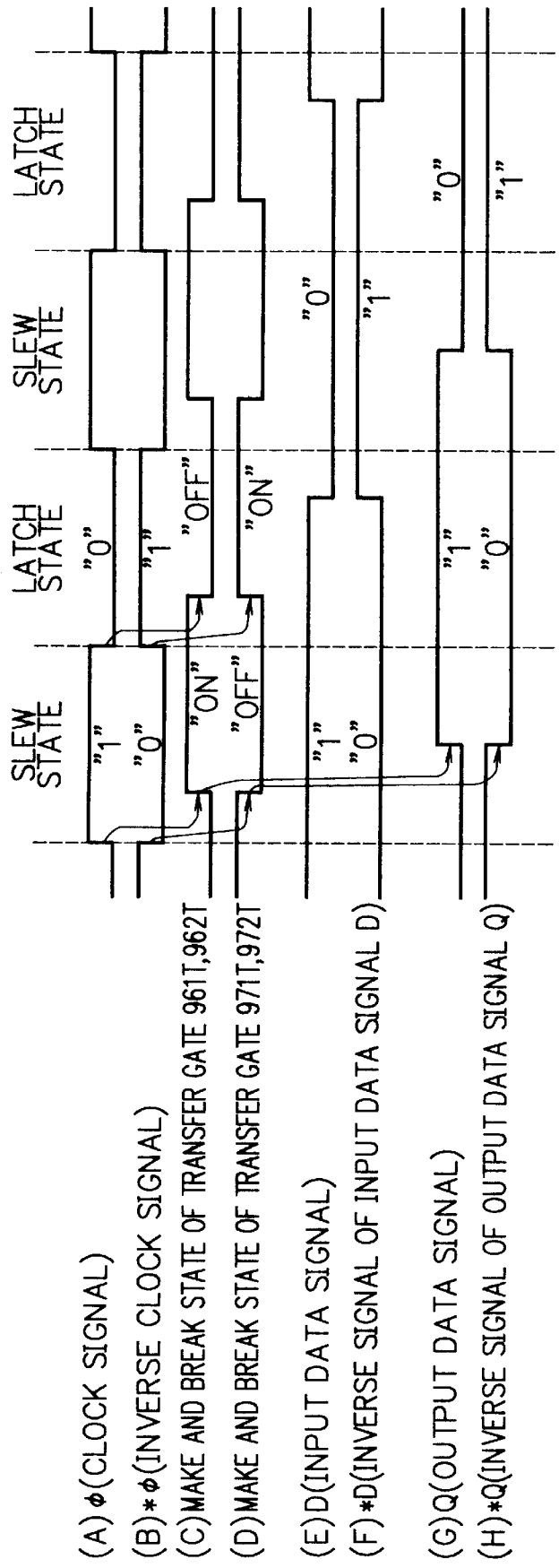
FIGS. 2A–2H are timing chart showing operation of the latch circuit of FIG. 1.

Representative embodiment of the present invention will be described. A latch circuit of the present invention, in the preferable embodiment, first pair of data signal input terminals are connected commonly both to a second data signal output terminal, and gates of first pair of complementary symmetrical PMOS transistor and NMOS transistor through respective first pair of sampling switch elements. Further second pair of data signal input terminals are connected commonly both to a first data signal output terminal and gates of second pair of complementary symmetrical PMOS transistor and NMOS transistor through respective second pair of sampling switch elements.

Further, the second data signal output terminal is connected to the second different pair of data signal output terminals and drains of the second pair of complementary symmetrical PMOS transistor and NMOS transistor respectively through the second holding switch elements, while the first data signal output terminal is connected to the first different pair of data signal output terminals and drains of the first pair of complementary symmetrical PMOS transistor and NMOS transistor respectively through the first holding switch elements.

Furthermore, a source of the PMOS transistor is connected to high electric potential power source terminal, thus supplying high electric power source voltage (VDD), while a source of the NMOS transistor is connected to low electric potential power source terminal, thus supplying low electric potential power source voltage (VSS), which is so called source terminating type constitution.

Moreover, the first and the second pair of sampling switch elements (61, 62, 63, and 64), and the first and the second pair of holding switch elements (71, 72, 73, and 74) are connected to the pair of control input terminals (41 and 51), thus causing switch elements to operate complementarily.

Due to the construction described above, it is capable of cutting a slew current flowing in between power sources in the process where particularly the clock signal and so forth change into active state, while reducing power dissipation of the latch circuit. It causes the first and the second pair of sampling switch elements (61, 62, 63, and 64) and the first and the second pair of holding switch elements (71, 72, 73, and 74) to operate complementarily, thereby when the pair of sampling switch elements (61, 62, 63, and 64) stand in an ON state, the pairs of holding switch elements (71, 72, 73, and 74) are capable in an standing of OFF state inevitably.

For this reason, in cases where an input data signal being supplied from the data input terminal group (11, 12, 13, and 14) controls gates of the pair of complementary symmetrical PMOS transistors and NMOS transistors through the sampling switch elements group (61, 62, 63, and 64) which already stand in an ON state, namely it causes ON state or OFF state to change complementarily, even if change-period in which both the PMOS transistor and the NMOS transistor stand in an ON state occurs, the holding switch element group (71, 72, 73, and 74) stand in an OFF state inevitably, with the result that slew current does not flow between high potential power source terminal supplying high electric potential power source voltage (VDD) and low electric potential power source terminal supplying low electric potential power source voltage (VSS), thus consuming no dissipation power.

Further, when both the PMOS transistors and NMOS transistors standing in an ON state elapses, and the PMOS transistors and the NMOS transistors are stabilized statically toward ON state or OFF state complementarily and symmetrically, the sampling switch element group (61, 62, 63, and 64) and the holding switch element group (71, 72, 73, and 74) operate complementarily. Here, when it causes the sampling switch element group (61, 62, 63, and 64) to stand in an OFF state, the holding switch element group (71, 72, 73, and 74) come into ON state inevitably. However already the change-period when both the PMOS transistors and NMOS transistors stand in an ON state is expired therefore the slew current does not flow between high potential power source terminal supplying high electric potential power source voltage (VDD) and low electric potential power source terminal supplying low electric potential power source voltage (VSS), thus consuming no dissipation power.

A preferred embodiment of the present invention will now be described in further detail referring to the accompanying drawings.

Figure 3:
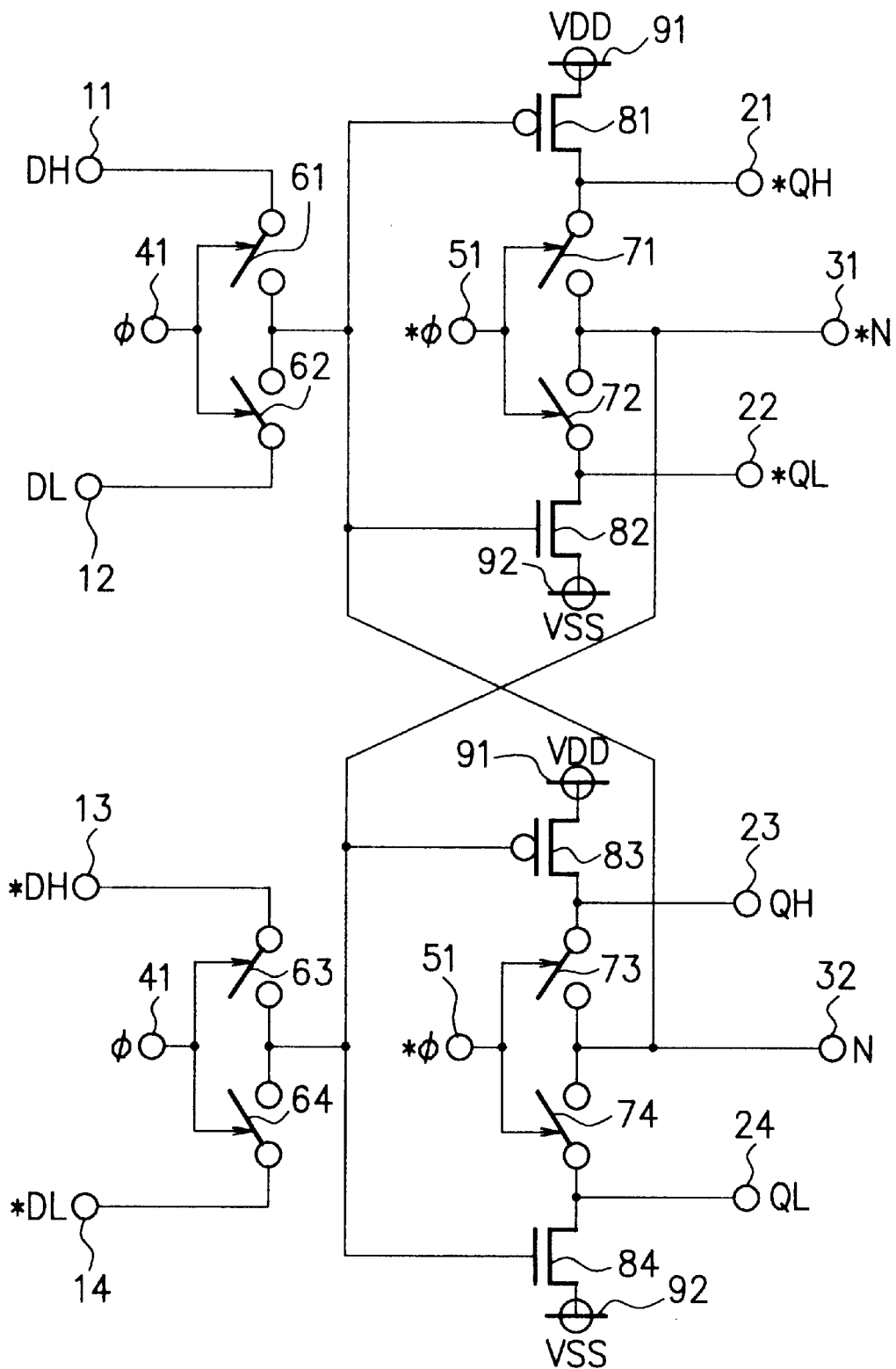
FIG. 3 is a view showing the configuration principle of a latch circuit according to the present invention.

FIG. 3 is a view showing a constitutional principle of a latch circuit according to an embodiment of the present invention.

Referring to FIG. 3, data signal input terminals 11 and 12 on one side are connected commonly to a data signal output terminal 32 through respective switch elements 61 and 62. The data signal input terminals 13 and 14 on the other side are connected commonly to a data signal output terminal 31 through respective switch elements 63 and 64.

Further, a data signal output terminal 32 on one side is connected to respective data signal output terminals 23 and 24 through switch elements 73 and 74 respectively. A data signal output terminal 31 on the other side is connected to respective data signal output terminals 21 and 22 through switch elements 71 and 72 respectively.

Furthermore, gates of the PMOS transistors 81 and 83 are connected to respective data signal output terminals 32 and 31. Drains of the PMOS transistors 81 and 83 are connected to respective data signal output terminals 21 and 23. Sources of the PMOS transistors 81 and 83 are connected commonly to high electric potential power-supply terminal 91 together with supplying high electric potential power-supply electric voltage VDD. Gates of the NMOS transistors 82 and 84 are connected to respective data signal output terminals 32 and 31. Drains of NMOS transistors 82 and 84 are connected to respective data signal output terminals 22 and 24. Sources of the NMOS transistors 82 and 84 are connected commonly to low electric potential power supply terminal 92 together with supplying low electric potential power-supply voltage VSS.

Switch elements 61, 62, 63, and 64 are connected to common control input terminal 41. Switch elements 71, 72, 73, and 74 are connected to common control input terminal 51. Due to these connections, the switch elements 61, 62, 63, and 64, and the switch elements 71, 72, 73, and 74 are operated complementarily.

The switch elements 61, 62, 63, 64, 71, 72, 73, and 74 are to be make-switch elements. Namely, such as NMOS transistor, these switch elements are switch elements which have the attribute that a control signal is "1", coming into ON state. In FIG. 3, there is indicated that the clock signal φ is supplied to the control input terminal 41 for the switch elements 61, 62, 63, and 64. There is indicated that the clock signal *φ is supplied to the control input terminal 51 for the switch elements 71, 72, 73, and 74.

On the other hand, it is suitable that these switch elements 61, 62, 63, 64, 71, 72, 73, and 74 are to be break switch element. Namely, such as PMOS transistor, these switch elements are switch elements which have the attribute that control signal is "0", coming into ON state. For instance, PMOS transistors 61P, 63P, 71P, and 73P are the case where it causes the switch elements 61, 63, 71, and 73 to replace with another switch elements having attribute of break switch element namely, the switch elements 61, 63, 71, and 73 are replaced with PMOS transistors. It causes gates of the PMOS transistors 61P and 63P to connect to the control input terminal 51, thus supplying inverse clock signal *φ. while it causes gates of the PMOS transistors 71P and 73P to connect to the control input terminal 41, thus supplying clock signal φ.

Figure 4:
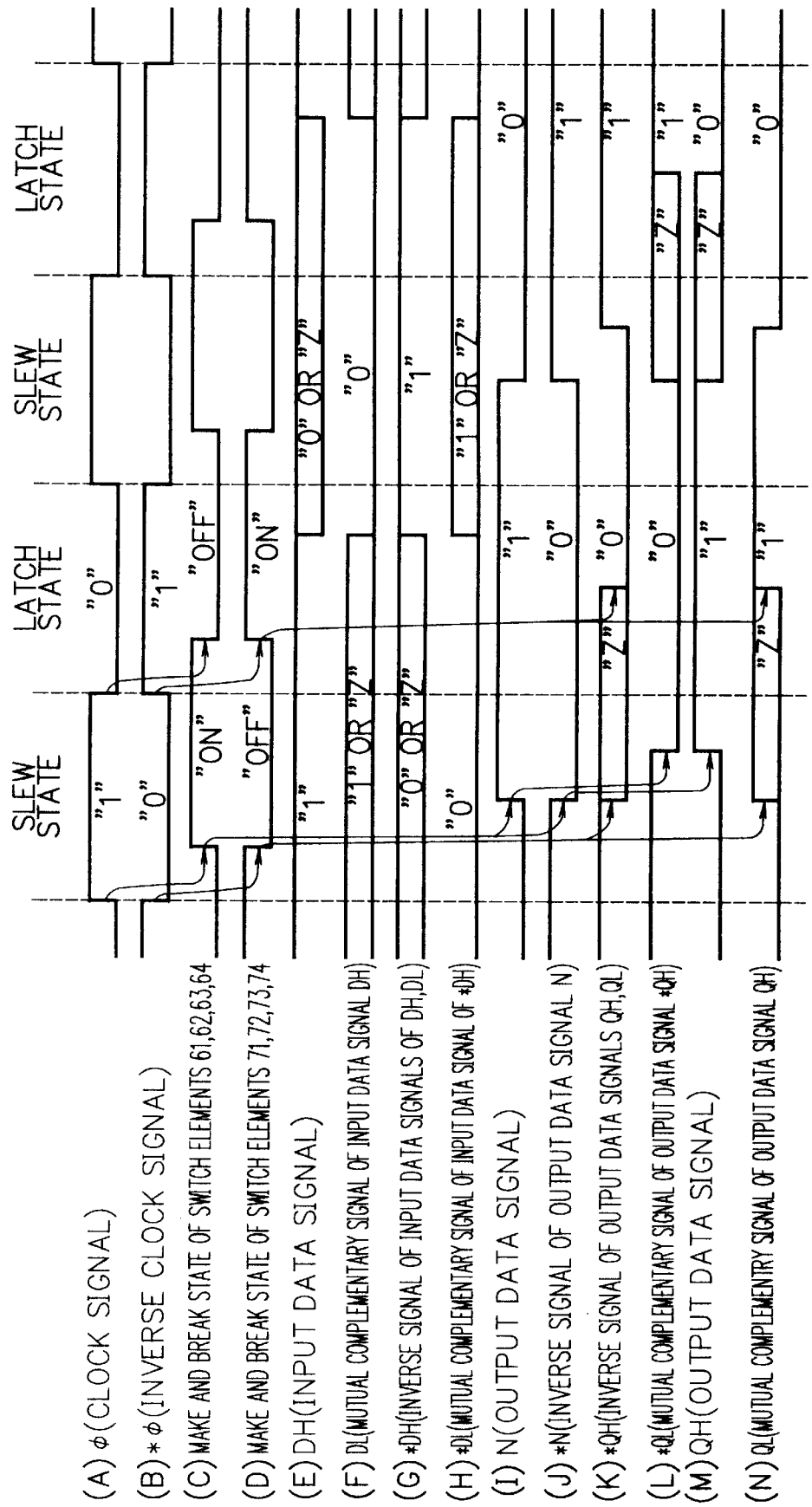
FIGS. 4(A)–4(N) are timing chart showing operation of the latch circuit of FIG. 3.

FIG. 4 is timing chart for explaining operation of the embodiment shown in FIG. 3. Operation of the embodiment will be described referring to FIGS. 3 and 4.

It is assumed that a first clock signal φ is "0", and an inverse clock signal *φ is "1", the switch elements 61, 62, 63, and 64 stand in an OFF state, the switch elements 71, 72, 73, and 74 stand in an ON state, further an input signal DH, an inverse output data signal *N, inverse output data *QH and *QL stand at "1", and an inverse input data signal *DL, an output data signal N, output data signals QL and QH stand at "0".

Under this condition, the PMOS transistor 81 and the NMOS transistor 84 stand in an ON state, while the NMOS transistor 82 and the PMOS transistor 83 stand in an OFF state. The PMOS transistor 81 and the NMOS transistor 84 are connected via mesh connection through respective switch elements 71 and 74 thus standing of static stable condition. Besides, it is assumed that the input data signal DL stands of "Z" or "1" as the signal extrapolating mutually to the input data signal DH, while the inverse input signal data *DH stands of "Z" or "0" as the signal extrapolating mutually to the input data signal *DL.

At this state, when it causes the clock signal φ to change into "1" and it causes the inverse clock signal *φ to change into "0", the switch elements 61, 62, 63 and 64 change into ON state, and the switch elements 71, 72, 73 and 74 change into OFF state. Due to this operation, a route in which the drain of the PMOS transistor 81 controls the gate of NMOS transistor 84 through the switch element 71 comes into shutdown state. And a route in which the drain of the NMOS transistor 84 controls the gate of the PMOS transistor 81 through the switch element 74 becomes shutdown state. Then the input data signal DH and the output data signal N become slew state, and the input data signal DH and inverse output data signal *QL become inverse slew-state. Similarly, the input data signal *DL and the inverse output data signal *N become slew-state, and the input data signal *DL and the output data signal QH become inverse slew-state.

No current of the input data signal DH flows into NMOS transistor 84 through the switch elements 61 and 74, similarly, no current of the input data signal *DL flows into the PMOS transistor 81 through the switch elements 64 and 71. Thereby, respective inverse output data signal *QL and output data signal QH are inverted with high speed through the NMOS transistor 82 and the PMOS transistor 83.

Besides, in the transient process that the NMOS transistor 82 and the PMOS transistor 83 change into ON state and the PMOS transistor 81 and the NMOS transistor 84 change into OFF state, because already the switch elements 71 to 74 have become completely OFF state, no slew current flows between the high electric potential power supply terminal 91 and low electric potential rower supply terminal 92, consequently, unnecessary power is not consumed.

Furthermore, delay time period from the time when the clock signal φ becomes active state to the time when the inverse output data signal *QL and the output data signal QH are inverted is the time period that the switch elements 61 to 64 change from OFF state to ON state, namely it becomes the sum of the delay time period from the time when the clock signal φ becomes active state to the time when the inverse output data signal *N and the output data signal N are inverted, and the time period when the NMOS transistor 82 and the PMOS transistor 83 change from OFF state to ON state.

Next, when it causes the clock signal φ to change into "0" and it causes the inverse clock signal *φ to change into "1", the switch elements 61, 62, 63 and 64 change into OFF state and the switch elements 71, 72, 73 and 74 change into ON state. Under this condition, there is constituted bistable circulation route by both the route that the drain of the NMOS transistor 82 controls the gate of NMOS transistor 84 through the switch element 72, and the route that the drain of the PMOS transistor 83 controls the gate of the NMOS transistor 82 through the switch element 73. This is latch-state. The output data signal N and the inverse output data signal *QL are connected to the inverse output data signal *N and the output data signal QH through the low resistive switch elements 72 and 73, thereby holding information is stable.

Further, at the same time, since the switch elements 71 and 73 stand in an ON state, the inverse output data signal *QH and the output data signal QL are ascertained as the same holding information as that of respective inverse output data signal *QL and output data signal QH.

In the timing chart of FIG. 4 which shows circuit operation of FIG. 3, the clock signal φ continuously is of "0", and the inverse clock signal *φ continuously is of "1", the switch elements 61, 62, 63 and 64 stand in the OFF state, while the switch elements 71, 72, 73 and 74 stand in the ON state. In the initial state, the input data signal DL, the inverse output data signal *N, the inverse output data signal *QL, and the inverse output data signal *QH stand of "0", while the inverse input data signal *DL, the output data signal N, the output data signal QH, and the output data signal QL stand of "1". A series of timing chart both of slew operation and latch operation from the initial state described above are indicated altogether. In the initial state, the input data signal DH and the input signal DL are complementary to each other, thus the input signal DH stands of "Z" or "0". The inverse input data signal *DL and the input data signal *DH are complementary to each other, thus the inverse input data signal *DL stands of "Z" or "1".

As described above, according to the present embodiment, of course the latch circuit has both of stability of information and high speed operation. It is capable of eliminating slew current completely flowing between power supplies in the transient process where the clock signal and so forth change into active state. In consequence, it is capable of avoiding waste of power dissipation.

Figure 5:
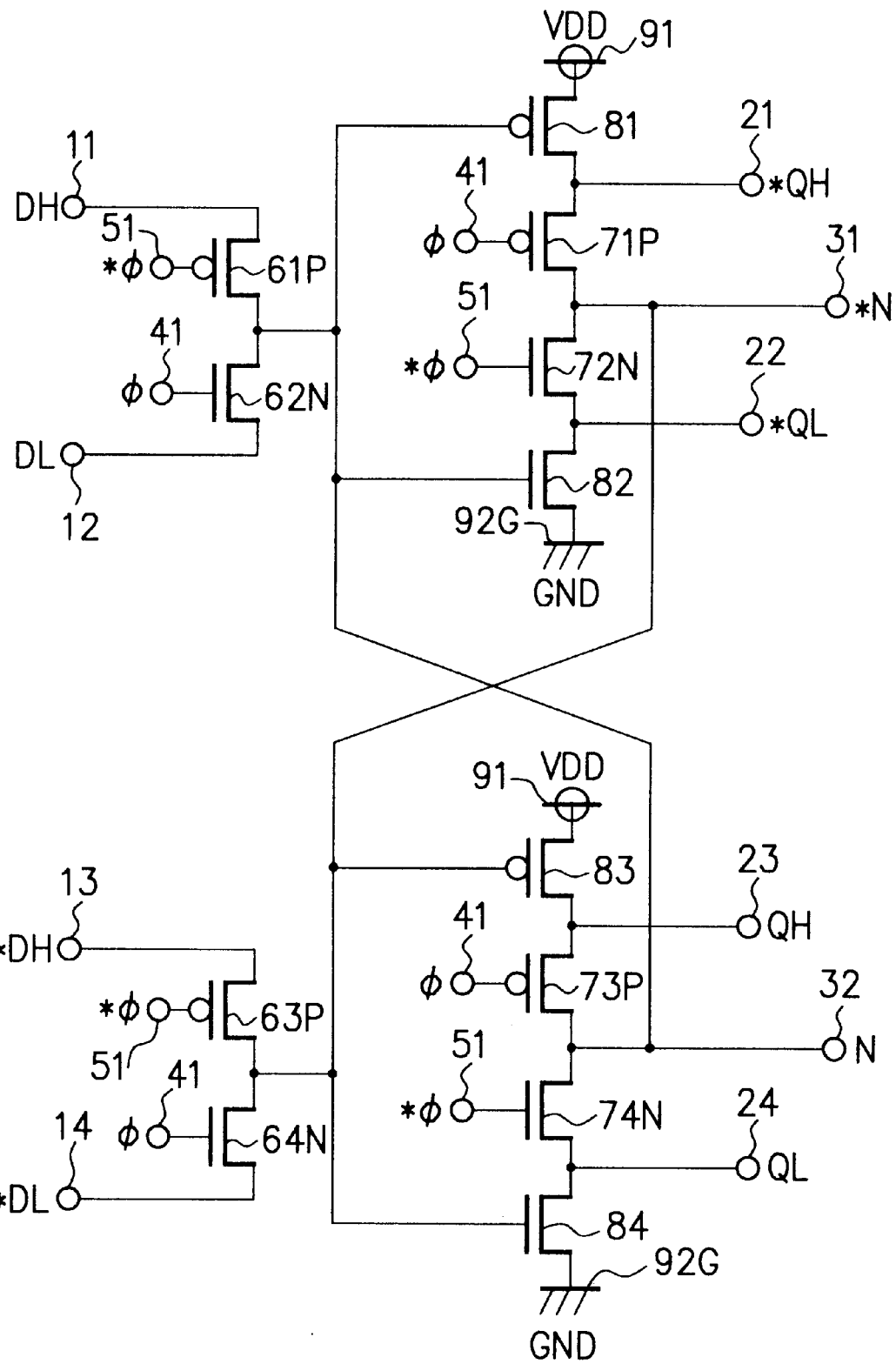
FIG. 5 is a view showing the configuration of a latch circuit according to a first embodiment of the present invention.

FIG. 5 is a view showing circuit configuration of the concrete latch circuit of one embodiment according to the present invention.

Referring to FIG. 5, similar to FIG. 3, in a latch circuit of the present embodiment, the switch elements 61 to 64 and 71 to 74 shown in the principle view of the latch circuit of FIG. 3 are make-switch elements. Namely, the switch elements have attribute that when the control signal to the gate is of "1", the switch element comes into ON state such as the NMOS transistor. FIG. 5 shows the case where the clock signal φ is supplied to the control input terminal 41 of the switch elements 61 to 64, and where the inverse clock signal *φ is supplied to the control input terminal 51 of the switch element 71 to 74. On the other hand, there are switch elements of a break-switch element which has attribute that when the control signal to the gate is of "0", the switch element comes into ON state such as the PMOS transistor.

Here, in the latch circuit of the first embodiment of the present invention as shown in FIG. 5, the switch elements 61, 63, 71, and 73 are replaced with the PMOS transistors 61P, 63P, 71P and 73P which are corresponding to the switch elements 61, 63, 71 and 73 having attribute of the break-switch element. The gates of the PMOS transistors 61P and 63P are connected to the control input terminal 51, thus supplying the inverse clock signal *φ, while the gates of the PMOS transistors 71P and 73P are connected to the control input terminal 41, thus supplying the clock signal φ.

Furthermore, the NMOS transistors 62N, 64N, 72N, and 74N are the switch elements having attribute of make-switch element corresponding to respective switch elements 62, 64, 72, and 74 shown in FIG. 3. The NMOS transistors 62N, 64N, 72N, and 74N are replaced with the switch elements 62, 64, 72, and 74. The gates of the NMOS transistors 62N and 64N are connected to the control input terminal 41, thus supplying the clock signal φ, while the gates of the NMOS transistors 72N and 74N are connected to the control input terminal 51, thus supplying the inverse clock signal *φ.

As described above, according to the first embodiment, the respective switch elements 61 to 64 and 71 to 74 correspond to the MOS transistors 61P, 62N, 63P, 64N, 71P, 72N, 73P, and 74N shown in FIG. 5 one by one, thus it is capable of constituting latch circuit by six elements which are the minimum transistor element number.

Figure 11:
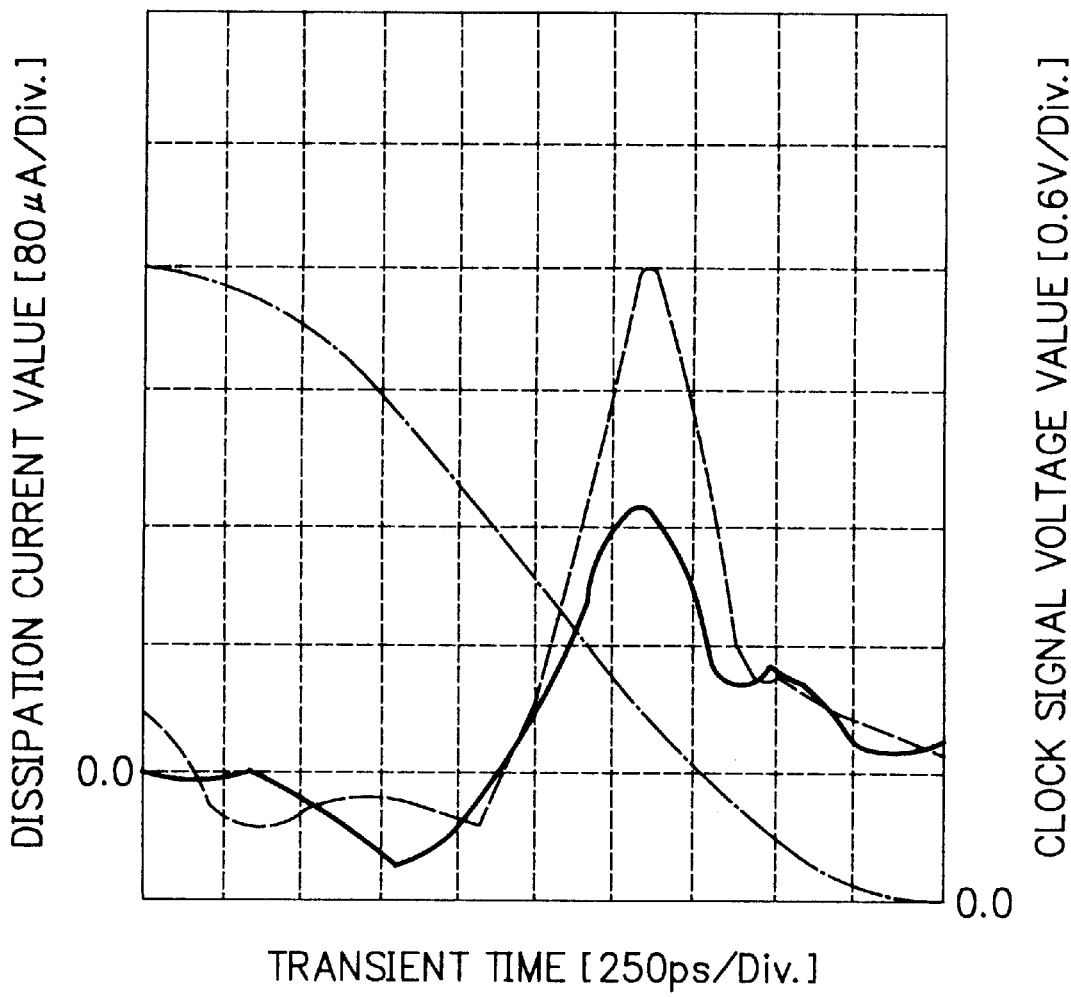
FIG. 11 is a view showing transient time characteristics of dissipation current value of the latch circuit according to the first embodiment of the present invention, and the conventional latch circuit of FIG. 1 as the comparison example.

The latch circuit of the present invention is constituted by using CMOS process having 0.35μ class gate length. FIG. 11 is a view showing transient time characteristic of dissipation current value of one embodiment of above case. In particular, FIG. 11 shows characteristic when it causes the latch circuit to change from latching state to slew-state. Further, a continuous line shown in the graph of FIG. 11 is a transient time characteristic of a dissipation current value according to the latch circuit of the first embodiment of the present invention shown in FIG. 5. A broken line shown in the graph of FIG. 11, as a comparison example, is a transient time characteristic of a dissipation current value according to the latch circuit of the conventional example shown in FIG. 1. Each of the characteristic is to refer to the left side division on the scale. Alternate long and short dash line which is to refer to the right side division on the scale shows time-change of a signal voltage value of the inverse clock signal *φ applied to the inverse clock signal input terminal 51 of the latch circuit both of FIG. 1 and FIG. 5. Here, sinusoidal wave shaped signal waveform is applied.

As understood from FIG. 11, the latch circuit of the first embodiment of the present invention suppresses the maximum value of the dissipation current to approximately 50% to the conventional latch circuit. And the latch circuit is to realize approximately 40% elimination of average value and integral action value. The latch circuit of the present invention is capable of realizing elimination of dissipation power remarkably.

Figure 6:
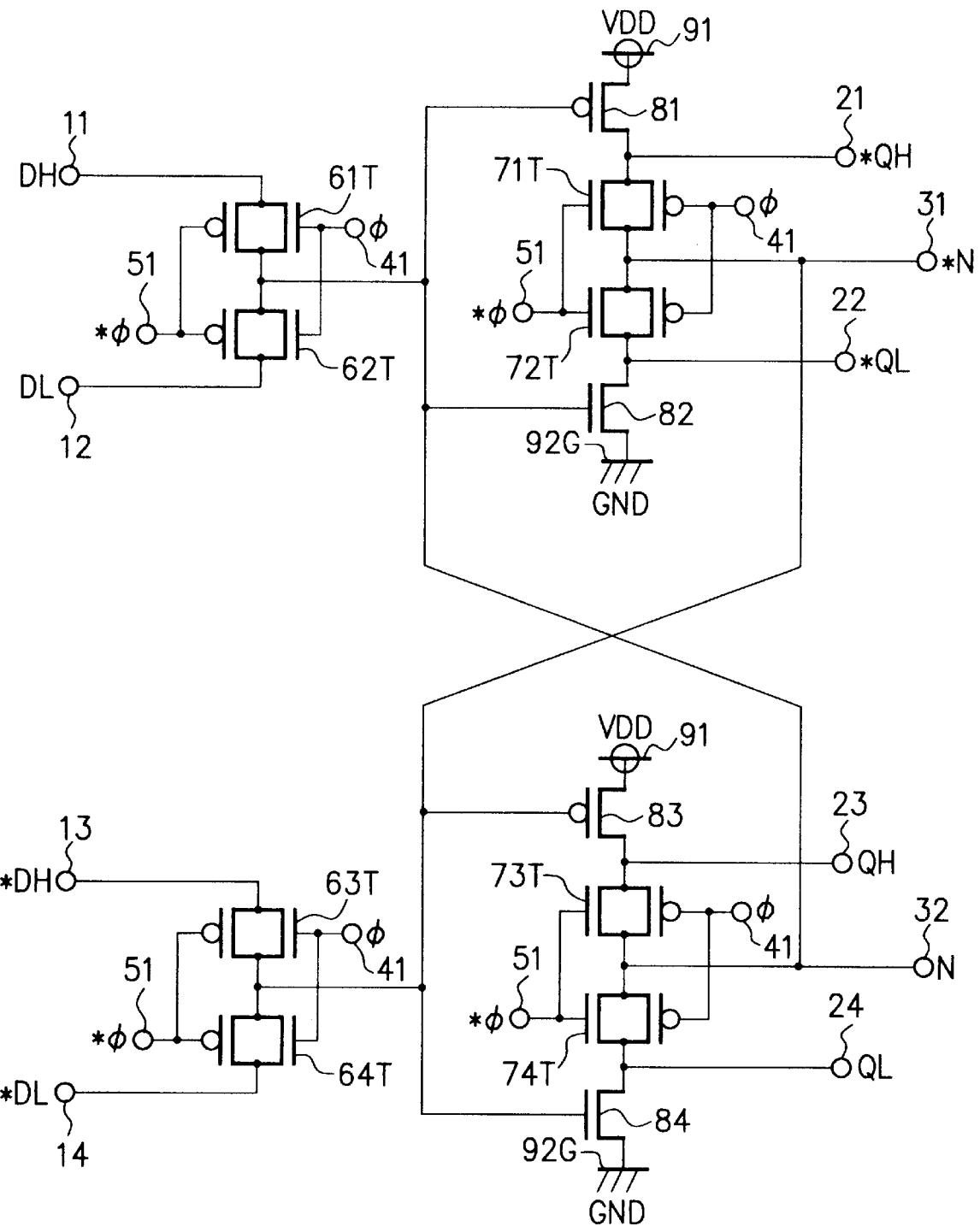
FIG. 6 is a view showing the configuration of a latch circuit according to a second embodiment of the present invention.

FIG. 6 is a view showing circuit constitution of concrete latch circuit which is a second embodiment of the present invention. Referring to FIG. 6, in a latch circuit of the present embodiment, the transfer gates 61T to 64T, and 71T to 74T correspond to the switch elements 61 to 64, and 71 to 74 shown in the principle constitution view of the latch circuit of FIG. 3. The transfer gates 61T to 64T and 71T to 74T have the same characteristic as that of the switch elements 61 to 64 and 71 to 74. The switch elements 61 to 64 and 71 to 74 are replaced with the transfer gates 61T to 64T and 71T to 74T. At this time, the gate of the PMOS transistor which gate is constitutional element of the transfer gates 61T to 64T is connected to the control terminal 51, thus supplying the inverse clock signal *φ, similarly the gate of the NMOS transistor which gate is constitutional element of the transfer gates 61T to 64T is connected to the control terminal 41, thus supplying the clock signal φ. While the gate of the NMOS transistor which gate is a constitutional element of the transfer gates 71T to 74T is connected to the control terminal 51, thus supplying the inverse clock signal *φ, similarly the gate of the PMOS transistor which gate is the element of transfer gates 71T to 74T is connected to the control terminal 41, thus supplying clock signal φ.

As described above, the transfer gate of CMOS is used as the switch element. Thereby, these transfer gates are capable of considering to be switch elements having linear resistance to signal which is passed therethrough. These transfer gates are capable of transferring low electric potential power source voltage GND as an electric potential showing "0" state, and high electric potential power source voltage VDE) as an electric potential showing "1" state. Consequently, it is capable of improving operation capability by using these transfer gates whose transferring characteristic is superior as a switch element, to the present latch circuit.

FIG. 7 is a view showing circuit configuration of applicable master-slave type D flip-flop circuit which is a third embodiment of the present invention. The third embodiment is an application example of the latch circuit of the above first embodiment.

In FIG. 7, the latch circuits X and Y surrounded by broken line is constituted from the same configuration elements as that of the latch circuit of the first embodiment shown in FIG. 5. Marks appended to the configuration of elements of the latch circuit X within FIG. 7 is the mark to which a letter X is added to end of the mark appended to the configuration of elements of FIG. 5. Similarly, a mark appended to configuration of element latch circuit Y is the mark which a letter Y is added to end of the mark appended to the configuration of element of FIG. 5.

The master-slave type D flip-flop circuit of the third embodiment of FIG. 7 is constituted that it causes the latch circuit Y having role of the slave circuit holding data to connect to the latch circuit X having role of the master circuit taking the data in. Namely, data signal output terminals 21X to 24X of the latch circuit X are connected to respective data signal input terminals 11Y to 14Y of the latch circuit Y.

A data signal input terminal 101 of the master-slave type D flip-flop circuit is connected to data signal input terminals 11X and 12X of the latch circuit X. Further sources of both of the PMOS transistor 111P and the NMOS transistor 112N are connected to high electric potential power source terminal 91 and low electric potential power source terminal 92G respectively. Drains of both of the PMOS transistor 111P and the NMOS transistor 112N are connected to the inverse data signal input terminals 13X and 14Y of the latch circuit X. Gates of both of the PMOS transistor 111P and the NMOS transistor 112N are connected to data signal input terminal 101 of the master-slave type D flip-flop circuit. Thereby an inverse data signal to the master-slave type D flip-flop circuit is generated automatically.

Furthermore, data signal output terminals 21Y and 22Y of the latch circuit Y are connected to data signal output terminal 102 of the master-slave type D flip-flop circuit.

Moreover, gates of the NMOS transistors 62NY, 64NY, and PMOS transistors 71PY, 73PY of the latch circuit Y are connected commonly to the clock signal terminal 41 with each other, further gates of the PMOS transistors 61PX, 63PX, and NMOS transistors 72NX, 74NX of the latch circuit X are connected commonly to the clock signal terminal 41 with each other, thus supplying clock signal φ. While gates of the PMOS transistor 61PY, 63PY, and NMOS transistor 72NY, 74NY of the latch circuit Y are connected commonly to the clock signal terminal 51 with each other, further gates of the NMOS transistors 62NX, 64NX, and the PMOS transistors 71PX, 73PX of the latch circuit X are connected commonly to the clock signal terminal 51, thus supplying the inverse clock signal *φ.

Figure 8:
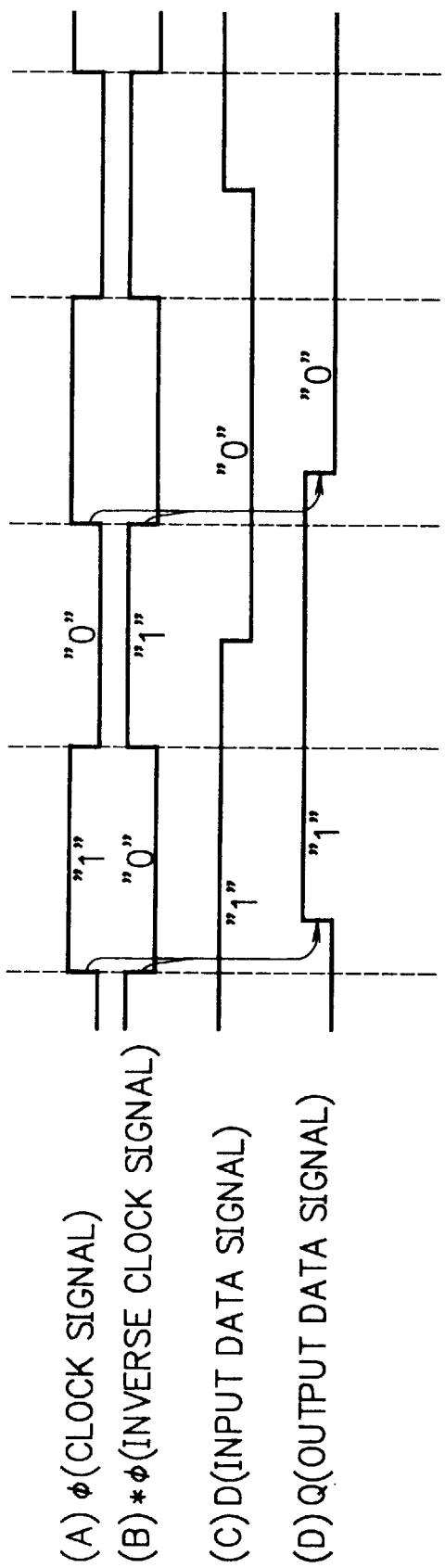
FIGS. 8(A)–8(D) are timing chart showing operation of the latch circuit of FIG. 7.

Next, operation of circuit shown in FIG. 7 will be described referring to FIG. 8.

It is assumed that the clock signal φ is "0" and the inverse clock signal *φ is "1", and the input data signal stands of "1" and the output data signal stands of "0". In this state, the latch circuit X stands of the inverse slew-state, and the latch circuit Y stands of latch-state.

Next, when it causes the clock signal φ to change into "1" and it causes the inverse clock signal *φ to change into "0", now the latch circuit X comes into latch-state, and the latch circuit Y comes into inverse slew-state, "1" appears in the output data signal Q.

Continuously, it causes the clock signal φ to change into "0" and it causes the inverse clock signal *φ to change into "1", again the latch circuit X comes into inverse slew-state, and the latch circuit Y comes into latch-state, "1" appears in the output data signal Q unchangeably. After changing the input signal D to "0", it causes the clock signal φ to change into "1" and it causes the inverse clock signal *φ to change into "0", again the latch circuit X comes into latch-state, and the latch circuit Y comes into inverse slew-state, now "0" appears in the output signal Q.

Figure 9:
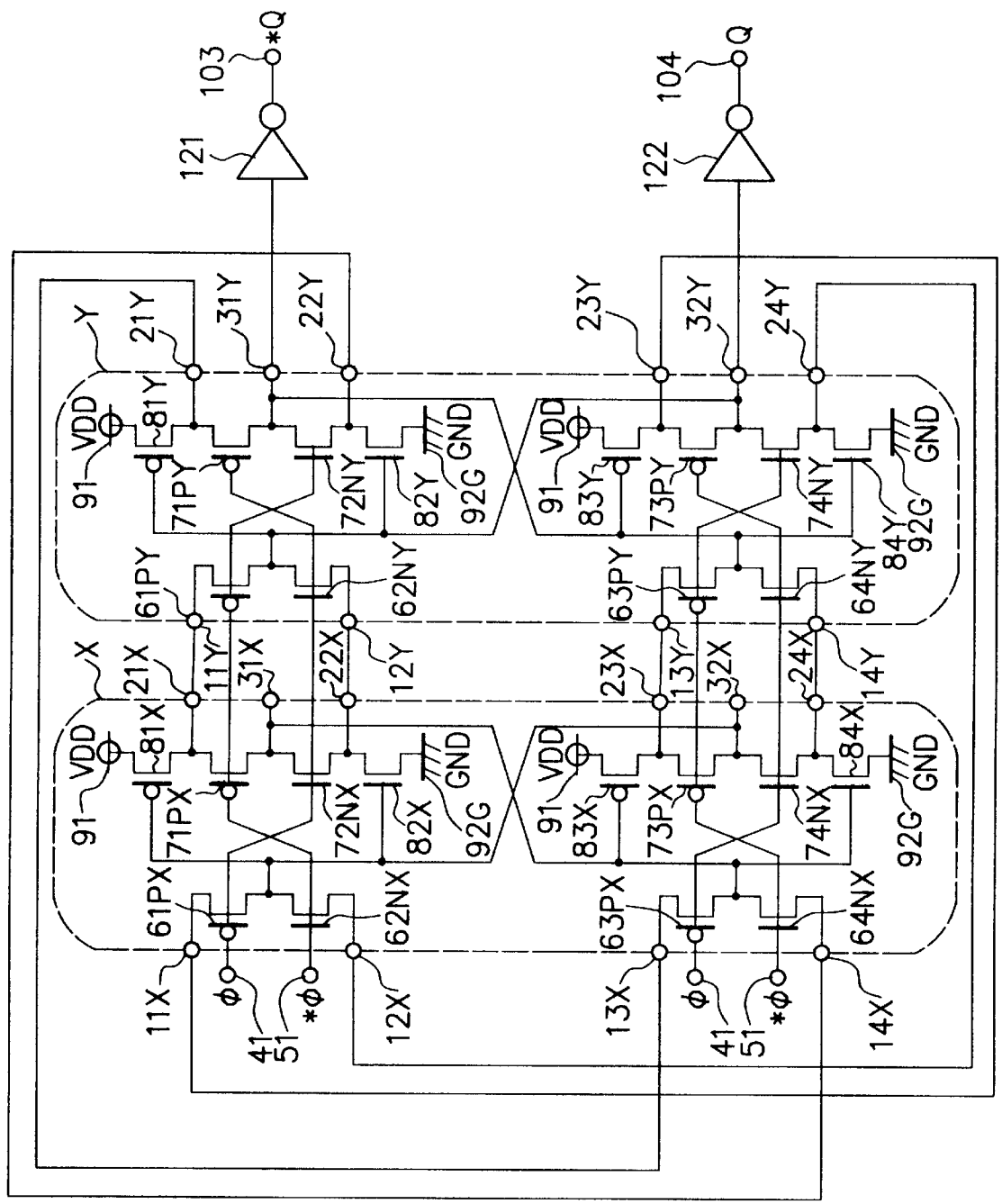
FIG. 9 is a view showing the configuration of a master slave type T flip-flop circuit according to a fourth embodiment of the present invention.

FIG. 9 is a view showing circuit configuration of further applicable master-slave type T flip-flop circuit which is a fourth embodiment of the present invention. The fourth embodiment is another application example of the above first embodiment.

In FIG. 9, the latch circuits X and Y surrounded by broken line is constructed from the same configuration of elements as that of the latch circuit of the first embodiment shown in FIG. 5. Marks appended to the configuration of elements of the latch circuit X within FIG. 7 is the mark to which a letter X is added to end of the mark appended to the configuration of elements of FIG. 5. Similarly, a mark appended to configuration of elements latch circuit Y is the mark which a letter Y is added to end of the mark appended to the configuration of elements of FIG. 5.

Referring to FIG. 9, in the master-slave type T flip-flop circuit of the fourth embodiment, the latch circuit X having role as master circuit which implements taking-in of data is connected to the latch circuit Y having a role as slave circuit holding data. Namely, it causes the data signal output terminals 21X to 24X of the latch circuit X to connect to the respective data signal input terminals 11Y to 14Y of the latch circuit Y. The other side, the data signal output terminals 21Y and 22Y of the latch circuit Y are connected to be intersected to data signal input terminals 13X and 14X of the latch circuit X, and the data signal output terminals 23Y and 24Y of the latch circuit Y are connected to be intersected to the data signal input terminal 11X and 12X of th latch circuit X. The latch circuit X having a role as the slave circuit which holds data follows the latch circuit Y having a role as the master circuit which implements taking-in of the data. The latch circuit X and the latch circuit Y have twisted looped circuit configuration.

Further, the data signal output terminals 31Y and 32Y of the latch circuit Y are connected to the data signal output terminals 103 and 104 of the master-slave type T flip-flop circuit through inverters 121 and 122.

Moreover, gates of the NMOS transistors 62NY, 64NY, and PMOS transistors 71PY, 73PY of the latch circuit Y are connected commonly to the clock signal terminal 41 with each other, further gates of the PMOS transistors 61PX, 63PX, and NMOS transistors 72NX, 74NX of the latch circuit X are connected commonly to the clock signal terminal 41 with each other, thus supplying clock signal φ. While gates of the PMOS transistor 61PY, 63PY, and NMOS transistor 72NY, 74NY of the latch circuit Y are connected commonly to the clock signal terminal 51 with each other, further gates of the NMOS transistors 62NX, 64NX, and the PMOS transistors 71PX, 73PX of the latch circuit X are connected commonly to the clock signal terminal 51, thus supplying the inverse clock signal *φ.

Figure 10:
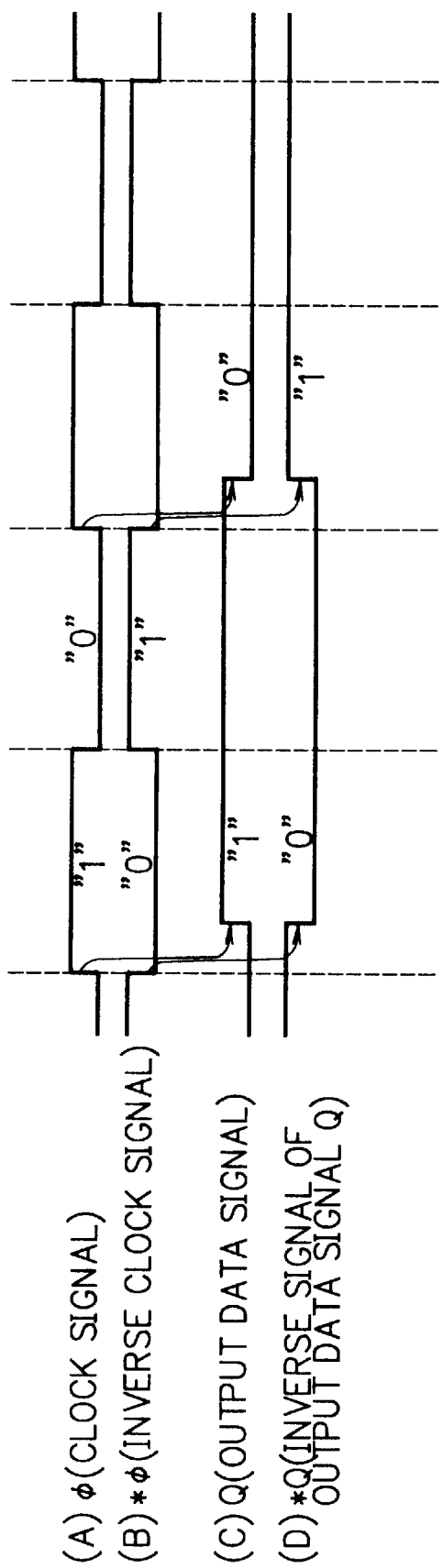
FIGS. 10(A)–10(D) are timing chart showing operation of the circuit of FIG. 9.

Next, operation of circuit shown in FIG. 9 will be described referring to timing chart of FIG. 10.

Firstly, it is assumed that the clock signal φ is "0" and the inverse clock signal *φ is "1", and the output data signal Q stands of "0" and the inverse output data signal *φ stands of "1". Under this state, the latch circuit X comes into inverse slew-state and the latch circuit Y comes into latch-state.

Next, when it causes the clock signal φ to change into "1" and it causes the inverse clock signal *φ to change into "0", here, the latch circuit X comes into latch-state, and the latch circuit Y comes into inverse slew-state, "1" and "0" appear in the output data signal Q and *Q respectively.

Continuously, it causes the clock signal φ to change into "0" and it causes the inverse clock signal *φ to change into "1", and it causes the latch circuit X to stand of the inverse slew-state and it causes the latch circuit Y to stand of the latch-state, before it causes the clock signal φ to change into "1" and it causes the inverse clock signal *φ to change into "0". Again the latch circuit X comes into latch-state, and the latch circuit Y comes into inverse slew-state, here "0" and "1" appear in the output data signal Q and *Q respectively.

As described above, the latch circuit according to the present invention, an input data signal for sampling, while controlling by clock signal, stands in a slew-state, and the other side, in the process of calculation writing inverse data to bistable element for holding, it is capable of avoiding slew current flowing transiently between power sources by switch element with OFF state provided between power sources. There is effect that it is capable of eliminating power dissipation.

While preferred embodiments of the invention have been described using specific terms, such description is for illustrative purpose only, and it is to be understood that changes and variations may be made without departing from the spirit or scope of the following claims.

What is claimed is:

1. A latch circuit comprising:
   a pair of sampling switch elements connected to a first control input terminal;
   a pair of CMOS inverters each CMOS inverter includes at least two transistors, said CMOS inverters are connected via mesh connection to said pair of sampling switch elements;
   an input terminal connected to a respective one sampling switch element of said pair of sampling switch elements;
   an output terminal connected to a respective one of a pair of holding switch elements and a respective one of said pair CMOS inverters, said pair of holding switch elements are part of timing circuitry for said pair of CMOS inverters and are each connected between the transistors of a respective one of said pair of CMOS inverters and to a second control input terminal;

wherein said pair of CMOS inverters are clocked respective to one another, and said pair of sampling switch elements connected at a first common terminal and said pair of holding switch elements, connected at a second common terminal maintain differential bistable signals of said latch circuit at said first common terminal and said second common terminal.

2. A latch circuit comprising:

a pair of transfer gates connected to a first control input terminal;

a pair of CMOS inverters connected via mesh connection to said pair of transfer gates;

an input terminal connected to said pair of transfer gates;

an output terminal connected to a pair of holding switch elements and at least one CMOS inverter of said pair of CMOS inverters, said holding switch elements are part of timing circuitry for said pair of CMOS inverters and are connected between a PMOS transistor and an NMOS transistor in at least one CMOS inverter of said pair of CMOS inverters and to a second control input terminal; and a second input terminal connected to the PMOS transistor and the NMOS transistor in the at least one CMOS inverter of said pair of CMOS inverters, wherein said pair of CMOS inverters are clocked respective to each other, and the at least one CMOS inverter of the pair of CMOS inverters includes the PMOS and NMOS transistors connected in series, the at least one CMOS inverter is connected between power sources and during a sampling period arrives at an OFF state.

3. A latch circuit comprising:

a first pair of data signal input terminals being connected commonly to gates of a first pair of complementary symmetrical PMOS transistor and NMOS transistor through a first pair of respective sampling switch elements;

a second pair of data signal input terminals, being connected commonly to gates of second pair of complementary symmetrical PMOS transistor and NMOS transistor through a second pair of respective sampling switch elements;

sources of said first pair of complementary symmetrical PMOS transistor and NMOS transistor being connected to high electric potential power source terminal and low electric potential power source terminal respectively, and drains thereof being connected to a first pair of data signal output terminals respectively;

sources of said second pair of complementary symmetrical PMOS transistor and NMOS transistor being connected to said high electric potential power source terminal and said low electric potential power source terminal respectively, and drains thereof being connected to a second pair of data signal output terminals respectively;

said first pair of data signal output terminals being connected to gates of said second pair of complementary symmetrical PMOS transistor and NMOS transistor through a respective one of a first pair of holding switch elements respectively; and said second pair of data signal output terminals being connected to gates of said first pair of complementary symmetrical PMOS transistor and NMOS transistor through a respective one of a second pair of holding switch elements respectively;

wherein said first pair of data signal input terminals and second pair of data signal input terminals are controlled complementarily;

said first pair of data signal input terminals are controlled complimentarily with each other;

said second pair of data signal input terminals are controlled complimentarily with each other; and said first pair of sampling switch elements, said second pair of sampling switch elements, said first pair of holding switch elements, and said second pair of holding switch elements are controlled complementarily with each other.

4. A latch circuit as claimed in claim 3, wherein said gates of said first pair of complementary symmetrical PMOS transistor and NMOS transistor are connected to a third data signal output terminal; and gates of said second pair of complementary symmetrical PMOS transistor and NMOS transistor are connected to a fourth data signal output terminal.

5. A latch circuit as claimed in claim 4, wherein said first pair of sampling switch elements, said second pair of sampling switch elements, said first holding switch elements, and said second holding switch elements are MOS transistors.

6. A bistable latch circuit comprising:

a first pair of sampling switch elements connected to a first control input terminal;

a second pair of sampling switch elements;

a pair of CMOS inverters each CMOS inverter includes at least two transistors, said CMOS inverters are connected via mesh connection to said first pair and said second pair of sampling switch elements;

a first pair of input terminals and a second pair of input terminals connected to said first pair and said second pair of sampling switch elements, respectively; and a first pair of output terminals and a second pair of output terminals connected to a first pair and a second pair of holding switch elements and said holding switch elements are each connected between the transistors of a respective one of said pair of CMOS inverters and said holding switch elements are connected to a second control input terminal, wherein said pair of CMOS inverters are clocked respective to each other, and said first pair and said second pair of sampling switch elements having at least one switch element connected to a first terminal and said first pair and said second pair of holding switch elements having at least one holding switch element connected to a second terminal maintain differential bistable signals of the latch circuit at said first terminal and said second terminal.

* * * * *